(12) United States Patent
Yakymyshyn et al.

(10) Patent No.: US 12,228,592 B2
(45) Date of Patent: Feb. 18, 2025

(54) CURRENT SENSOR FOR ELECTRICAL CONDUCTORS

(71) Applicant: Consolidated Edison Company of New York, Inc., New York, NY (US)

(72) Inventors: Chris Paul Yakymyshyn, Seminole, FL (US); John-Paul Laglenne, Ardsley, NY (US)

(73) Assignee: CONSOLIDATED EDISON COMPANY OF NEW YORK, INC., New York, NY (US)

( * ) Notice: Subject to any disclaimer, the term of this patent is extended or adjusted under 35 U.S.C. 154(b) by 227 days.

(21) Appl. No.: 17/871,348

(22) Filed: Jul. 22, 2022

(65) Prior Publication Data

US 2024/0027499 A1    Jan. 25, 2024

(51) Int. Cl.
*G01R 15/14*    (2006.01)
*G01R 15/20*    (2006.01)
*G01R 19/145*   (2006.01)
*H05K 5/02*     (2006.01)

(52) U.S. Cl.
CPC ......... *G01R 15/148* (2013.01); *G01R 15/207* (2013.01); *G01R 19/145* (2013.01); *H05K 5/0247* (2013.01)

(58) Field of Classification Search
CPC .. G01R 15/148; G01R 15/207; G01R 19/145; H05K 5/0247
See application file for complete search history.

(56) References Cited

U.S. PATENT DOCUMENTS

| | | | |
|---|---|---|---|
| 7,164,263 B2 | 1/2007 | Yakymyshyn et al. | |
| 9,063,184 B2* | 6/2015 | Carpenter | G01R 33/09 |
| 9,698,609 B2* | 7/2017 | Gilbert | G01R 15/14 |
| 9,952,257 B2 | 4/2018 | Walker et al. | |
| 10,393,775 B2* | 8/2019 | Weiss | G01R 15/181 |
| 10,690,701 B2 | 6/2020 | Walker et al. | |
| 2017/0184635 A1* | 6/2017 | Ugge | G01R 15/207 |

* cited by examiner

*Primary Examiner* — Reena Aurora
(74) *Attorney, Agent, or Firm* — CANTOR COLBURN LLP

(57) ABSTRACT

A sensor and a method of measuring an electrical characteristic of a conductor is provided. The sensor includes a first and second housings slidably coupled to move from a first to a second position. A first set of magnetic field sensors are coupled to the first housing. Each of the first magnetic field sensors having a different sensing axis and output a first signal in response to power flowing through the conductor. A second set of magnetic field sensors are coupled to the second housing. Each of the second magnetic field sensors having a different sensing axis and output a second signal in response to power flowing through the conductor. A circuit is coupled to receive signals from the first and second magnetic field sensors. The circuit is configured to generate a low energy signal in response to receiving the first and second signals.

23 Claims, 13 Drawing Sheets

CURRENT SENSOR FOR ELECTRICAL CONDUCTORS

BACKGROUND

The subject matter disclosed herein relates to a system and method of measuring and monitoring current and voltage in electrical conductors such as power lines, and in particular to sensor system that is light weight making it suitable for mounting in areas where the electrical conductor has a low level of support.

Electrical current and voltage are common parameters that are measured to verify or ensure operational characteristics of a an electrical conductor are within desired ranges. In the case of alternating current (AC) electrical conductors, these sensors typically utilize current transformers. Current transformers scale the large values of current to small, standardized values that are measurable by measuring instruments and protective relays. The instrument transformers isolate measurement or protection circuits from the high voltage of the primary electrical power line. A current transformer provides a secondary current that is accurately proportional to the current flowing in its primary.

Current transformers are typically formed using a steel ring core and a secondary winding made from a copper wire. Based on the number turns in the secondary winding, the current in the primary electrical power line is scaled and provided as an output of the current transformer. It should be appreciated that current transformers are heavy due to the use of the steel core. The weight of the current transformer inhibits their use on electrical power lines in the field. Further, their use in distribution voltage applications (e.g. up to 39 kV) may result in a high energy signal being transmitted by the current transformer.

Accordingly, while existing monitoring systems are suitable for their intended purposes the need for improvement remains, particularly in providing a lower weight sensor that transmits low energy signals.

BRIEF DESCRIPTION

According to one aspect of the disclosure a sensor for an electrical conductor is provided. The electrical sensor includes a first housing and a second housing slidably coupled to the first housing from a first position to a second position, the first housing and second housing cooperating to form a ring when the second housing is in the first position. A first plurality of magnetic field sensors are operably coupled to the first housing, each of the first plurality of magnetic field sensors having a different sensing axis, each of the first plurality of magnetic field sensors being configured to output a first signal in response to electrical power flowing through the electrical conductor. A second plurality of magnetic field sensors are operably coupled to the second housing, each of the second plurality of magnetic field sensors having a different sensing axis, each of the second plurality of magnetic field sensors being configured to output a second signal in response to electrical power flowing through the electrical conductor. A circuit electrically is coupled to receive a plurality of first signals from the first plurality of magnetic field sensors and the second plurality of magnetic field sensors, the circuit configured to generate a low energy output signal in response to receiving the first signals and second signals.

In addition to one or more of the features described herein, or as an alternative, further embodiments of the electrical sensor may include the first ring having a first end; the second ring having a second end, the first end and second end defining a gap when the second ring is in the first position; and the gap being sized to allow the electrical conductor to pass therethrough when the electrical sensor is being installed on the electrical conductor.

In addition to one or more of the features described herein, or as an alternative, further embodiments of the electrical sensor may include a first electrostatic board operably coupled to the first plurality of magnetic field sensors and a second electrostatic board operably coupled to the second plurality of magnetic field sensors.

In addition to one or more of the features described herein, or as an alternative, further embodiments of the electrical sensor may include the first housing and second housing being made from an electrically insulative material.

In addition to one or more of the features described herein, or as an alternative, further embodiments of the electrical sensor may include the insulative material being a high density polyethylene.

In addition to one or more of the features described herein, or as an alternative, further embodiments of the electrical sensor may include the first housing having a first tab and the second housing having a second tab.

In addition to one or more of the features described herein, or as an alternative, further embodiments of the electrical sensor may include the first tab and second tab each having a hole sized to receive a hot stick.

In addition to one or more of the features described herein, or as an alternative, further embodiments of the electrical sensor may include the first housing and second housing being offset from each other.

In addition to one or more of the features described herein, or as an alternative, further embodiments of the electrical sensor may include the second housing having an internal channel sized to receive the second plurality of magnetic field sensors.

In addition to one or more of the features described herein, or as an alternative, further embodiments of the electrical sensor may include a conductor electrically coupled the first plurality of magnetic field sensors and the second plurality of magnetic field sensors.

In addition to one or more of the features described herein, or as an alternative, further embodiments of the electrical sensor may include the internal channel having a slot sized to receive the conductor when the second housing is in the first position.

In addition to one or more of the features described herein, or as an alternative, further embodiments of the electrical sensor may include the first signal and second signal corresponding to a level of current flowing through the electrical conductor.

In addition to one or more of the features described herein, or as an alternative, further embodiments of the electrical sensor may include the first signal and second signal corresponding to a voltage level of the electrical power flowing through the electrical conductor.

In addition to one or more of the features described herein, or as an alternative, further embodiments of the electrical sensor may include at least one electrical insulator being operably coupled to a first clamp and a second clamp, the first clamp and second clamp being configured to secure the electrical conductor to the electrical sensor.

In addition to one or more of the features described herein, or as an alternative, further embodiments of the electrical sensor may include the at least one electrical insulator being operably coupled to the first housing and second housing to position the electrical conductor in a fixed position that is centrally located between the first housing and second housing.

In addition to one or more of the features described herein, or as an alternative, further embodiments of the electrical sensor may include a support bar coupled between the at least one electrical insulator, the first clamp, and the second clamp.

In addition to one or more of the features described herein, or as an alternative, further embodiments of the electrical sensor may include the support bar being made from a conductive material.

In addition to one or more of the features described herein, or as an alternative, further embodiments of the electrical sensor may include the conductive material being aluminum.

In addition to one or more of the features described herein, or as an alternative, further embodiments of the electrical sensor may include the first clamp or second claim being electrically isolated from the support bar.

In addition to one or more of the features described herein, or as an alternative, further embodiments of the electrical sensor may include an axis of the electrical conductor being perpendicular to the orientation of the first housing and second housing.

According to another aspect of the disclosure a method of measuring an electrical characteristic of an electrical conductor is provided. The method includes: providing a second having a first housing, a second housing, and a pair of clamps that are operably coupled to the first housing and second housing by an insulator, the second housing movable from a first position to a second position; sliding a second housing to the second position to define a gap between a first end of the first housing and a second end of the second housing; coupling the clamps to the electrical conductor; sliding the second housing to the first position; receiving a magnetic field generated by the electrical conductor by a first plurality of magnetic sensors arranged within the first housing and generating a first plurality of signals by the first plurality of magnetic sensors; receiving the magnetic field by a second plurality of magnetic sensors arranged within the second housing an generating a second plurality of signals by the second plurality of magnetic sensors; and generating a low energy output signal indicating the electrical characteristic in response to receiving the first signals and second signals.

In addition to one or more of the features described herein, or as an alternative, further embodiments of the method may include arranging each of the first plurality of magnetic sensors to have a different sensing axis, and arranging each of the second plurality of magnetic sensors to have a different sensing axis.

In addition to one or more of the features described herein, or as an alternative, further embodiments of the method may include the electrical characteristic being a current level of electrical power flowing through the electrical conductor.

These and other advantages and features will become more apparent from the following description taken in conjunction with the drawings.

BRIEF DESCRIPTION OF DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

The detailed description explains embodiments of the disclosure, together with advantages and features, by way of example with reference to the drawings.

DETAILED DESCRIPTION

Embodiments of the present disclosure provide for a sensor for measuring electrical characteristics that is light in weight to be coupled to a pole mounted AC electrical power line. Embodiments of the present disclosure further provide for a sensor that measures electrical characteristics of distribution voltage applications (e.g. up to 52 kV) while outputting a low energy signal (e.g. 0 to 10 VAC). Still further embodiments of the present disclosure provide a desired level of accuracy over a large temperature range (e.g. ~+/−0.1% over 100 C).

It should be appreciated that while embodiments herein may refer to a sensor system that measures AC electrical characteristics on an electrical power line, this is for exemplary purposes and the claims should not be so limited. In other embodiments the sensor system may be used in other applications, such as measuring direct current (DC) electrical characteristics or in non-pole mounted power line applications, such as on subterranean electrical distribution power lines for example.

Figure 1:
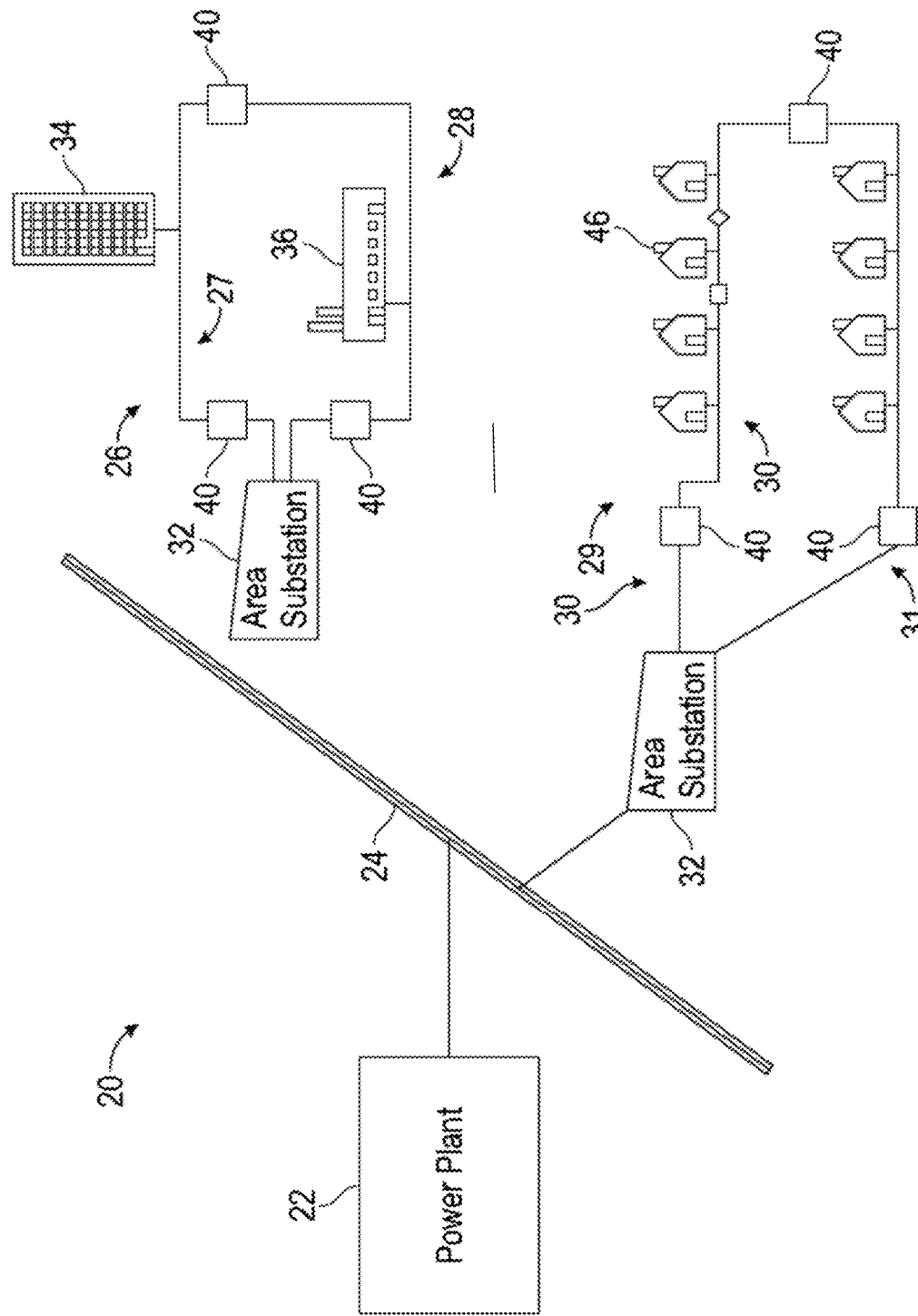
FIG. 1 is a schematic illustration of a utility electrical distribution system.

Referring now to FIG. 1, an embodiment is shown of a utility electrical distribution system 20. The utility system 20 includes one or more power sources 22 connected in parallel to a main transmission system 24. The power sources 22 may include, but are not limited to: coal, nuclear, natural gas, or incineration power plants. Additionally, the power source 22 may include one or more facilities that generate electricity based on renewable energy sources, such as but not limited to hydroelectric, solar, or wind turbine power plants. It should be appreciated that additional components such as transformers, switchgear, fuses and the like (not shown) may be incorporated into the utility system 20 as needed to ensure the efficient operation of the system. The utility system 20 is typically interconnected with one or more other utility networks to allow the transfer of electrical power into or out of the utility system 20.

The main transmission system 24 typically consists of high transmission voltage power lines, anywhere from 69 KV to 500 KV for example, and associated transmission and distribution equipment which carry the electrical power from the point of production at the power source 22 to the end users located on local electrical distribution systems 26, 29. The local distribution systems 26, 29 are connected to the main distribution system by area substations 32 which reduce transmission voltage to distribution levels such as 13 KV, 27 KV or 33 KV for example, sometimes referred to as medium voltage power lines. Area Substations 32 typically contain one or more transformers, switching, protection, and control equipment. Area Substations 32 all include circuit breakers to interrupt faults such as short circuits or over-load currents that may occur. Area substations 32 may also include equipment such as fuses, surge protection, controls, meters, capacitors, and load tap changers for voltage regulation.

The area substations 32 connect to one or more local electrical distribution systems, such as local distribution system 26, for example, that provides electrical power to a commercial area having end users such as an office building 34 or a manufacturing facility 36. In an embodiment, the area substation 32 may have two or more feeder circuits that provide electrical power to different feeder circuit branches 27, 28 of the local distribution system 26.

The residential distribution system 29 includes one or more residential buildings 46 and light industrial or commercial operations. Similar to the commercial distribution network 26, the residential distribution system 29 is divided into multiple branch feeders 30, 31 that are fed by the area substation 32. In an embodiment, the local distribution system 29 is arranged such that approximately up to 6 MVA of power is provided on each branch circuit for electrical loads such as residential buildings.

It should be appreciated that it may be desirable for the utility to monitor the voltage and current of the utility system 20 at various locations between the power source 22 and the end-user building 34, 46 (i.e. loads). Traditionally, the measurement of electrical characteristics of the power line, such as medium voltage power lines for example, are performed by discrete sensors. For example, measurement of current is performed using a sensor having a current transformer. These sensors are mounted directly to the uninsulated medium voltage power line. However, these sensors are arranged in close proximity to the live or "hot" power line. Thus it is difficult for utility personnel (sometimes referred to as linemen) to install or remove the sensors using common tools utilized by utility personnel, such as a so called hot-stick or shotgun stick. As used herein, the terms "hot-stick" or "shotgun stick" refers to a tool utilized by linemen that includes an elongated insulated body having a movable operating hook at one end. The operating hook is actuated by a sliding trigger mechanism at an opposite end of the body from the hook. The shotgun stick allows, in some circumstances, for linemen to manipulate or move electrical components that are in contact with live power lines. It should further be appreciated that these discrete sensors that use current transformers are heavy and place mechanical stresses on the electrical power lines. As a result, the locations where the current transformer based sensors are mounted must be carefully chosen to avoid adversely impacting the durability of the electrical power lines.

Figure 2A:
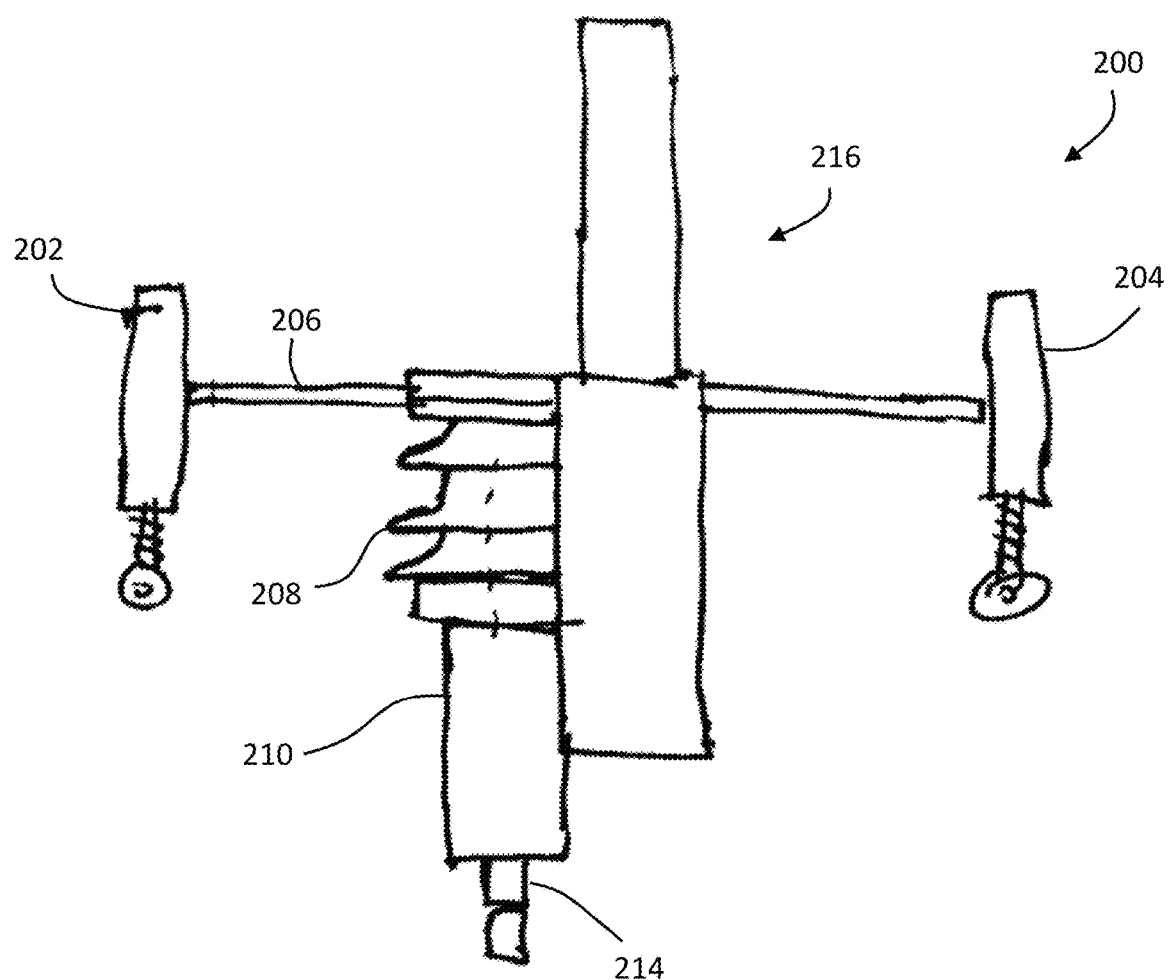
FIG. 2A is a side view illustration of a sensor that measures current and/or voltage in a pole mounted power line of the utility electrical distribution system of FIG. 1 in accordance with an embodiment.
Figure 2B:
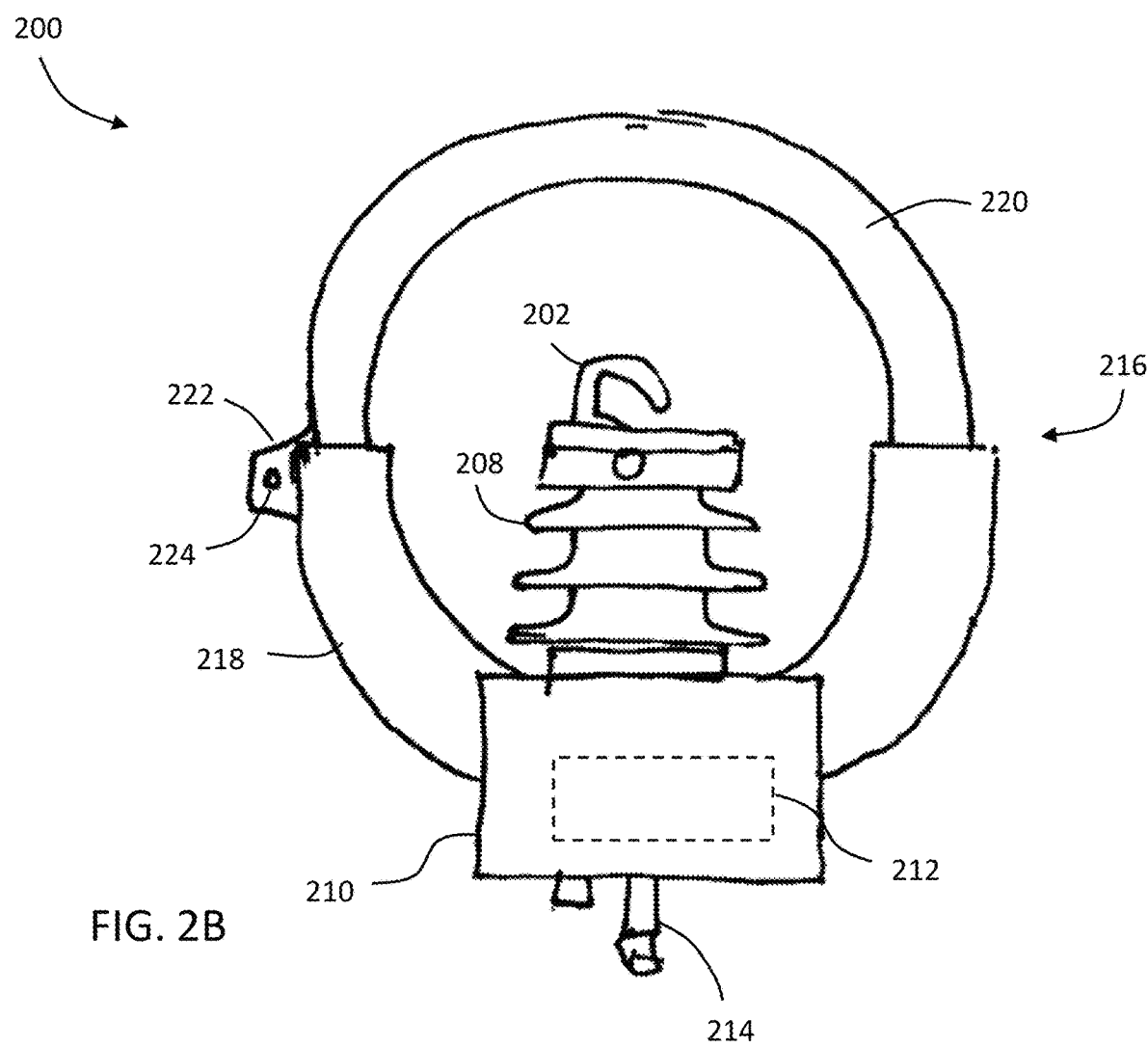
FIG. 2B is an end view illustration of the sensor of FIG. 2A in accordance with an embodiment.

Referring now to FIGS. 2A and 2B, a sensor system 200 is provided that is accurate and light weight enough to be installed-on or removed-from a live power line, such as a medium voltage power line having a voltage of 13 KV, 27 KV or 33 KV for example. The sensor system 200 includes a pair of clamps 202, 204 that are coupled by a substantially rigid support bar 206. In an embodiment, the support bar 206 is made from an electrically conductive material, such as aluminum for example. Centrally disposed on the support bar 206 is an insulator body 208. It should be appreciated that the insulator body 208 electrically isolates the support bar 206 and the clamps 202, 204 from the rest of the sensor system 200. The support bar 206, insulator body 208, and clamps 202, 204 cooperate to prevent the housings/portions 218, 220 from rotating or tilting relative to the conductor coupled to the clamps 202, 204.

Figure 8:
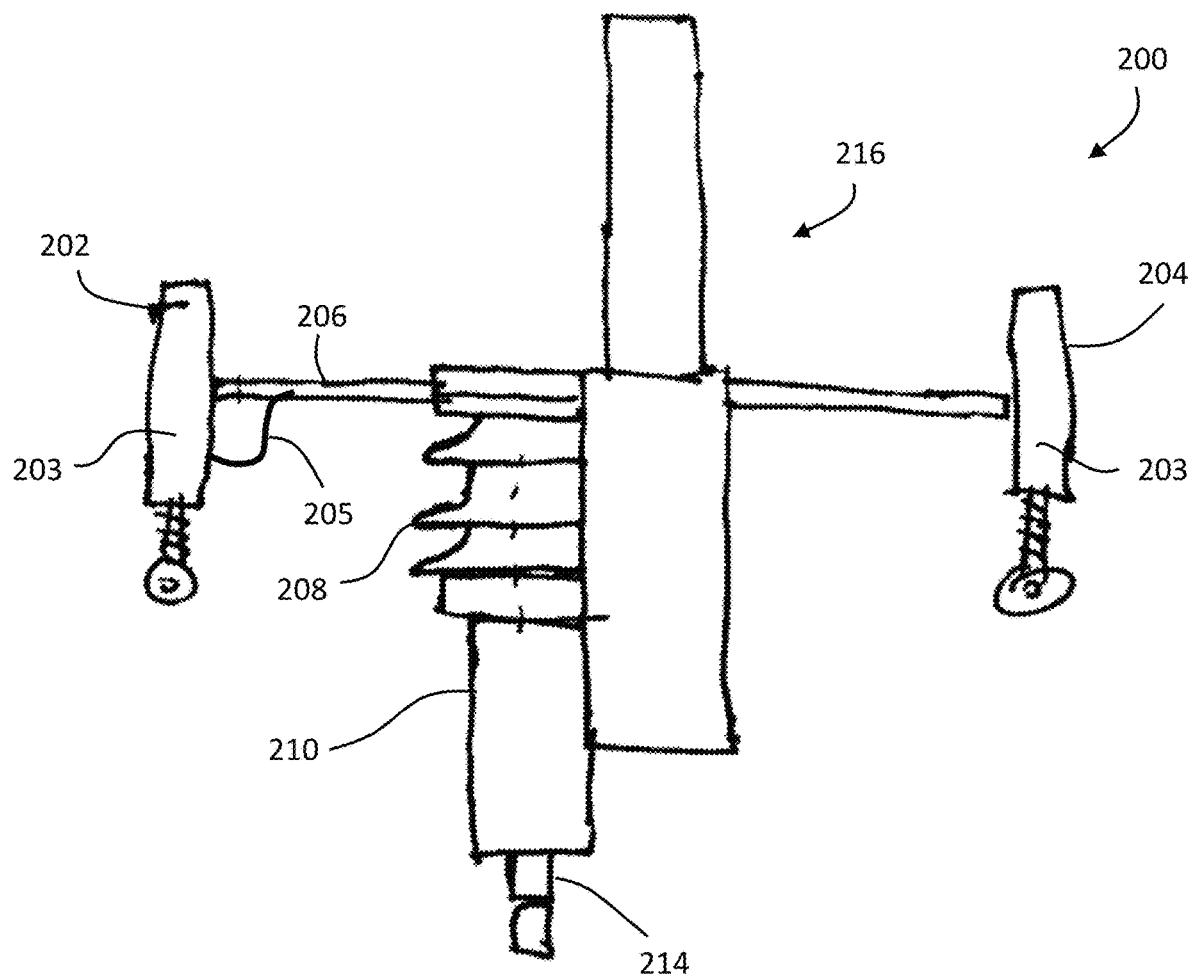
FIG. 8 is a side view illustration of a sensor in accordance with another embodiment.

In an embodiment, one of the clamps 202 or 204 is electrically isolated from the support bar 206 to prevent electrical current from flowing through the support bar 206. In one embodiment, shown in FIG. 8, the clamps 202, 204 are both formed from a body 203 that electrically isolates the clamping portion of the clamps from the support bar 206. In this embodiment, a conductor 205 electrically couples the clamp 202 to the support bar 206. Since the support bar 206 is electrically coupled to the conductor being measured in at least one location, undesirable electrical discharge activities can be avoided when the conductor is energized to high voltage.

Coupled to the insulator body opposite the support bar 206 is an electronics housing 210. As will be discussed in more detail herein, the electronics housing 210 includes electronics 212 (digital or analog) that receive signals from a plurality of magnetic field point sensors and outputs a low energy signal (e.g. 0 to 10 VAC) to a communications line 214. It should be appreciated that the communications line 214 may transmit to a suitable computing device (either locally or remote) that is configured to monitor the electrical characteristics of the AC power line.

Coupled to the electronics housing 210 is a ring assembly 216. In the illustrated embodiment, the ring assembly 216 is comprised of a lower ring portion 218 and an upper ring portion 220. The lower ring portion 218 is coupled to the electronics housing 210. The upper ring portion 220 is slidably coupled to the lower ring portion 218 such that the upper ring portion 220 may be moved from a first position (FIG. 2B) to a second position (FIG. 6) to define an opening between an end 600 of the lower ring portion 218 and an end 602 of the upper ring portion 220 to define a gap 604. As will be discussed in more detail herein, by moving the upper ring portion 220 to the second position, the utility personnel can install the sensor system 200 on a live or active electrical power line by passing the electrical power line through the gap 604. Each of the lower ring portion 218 and the upper ring portion includes a tab 222 having an opening 224 therein. The opening is sized to receive an end effector of a hot-stick or shotgun stick to allow the utility personnel to engage the sensor system 200 the portions 218, 220.

Figure 3A:
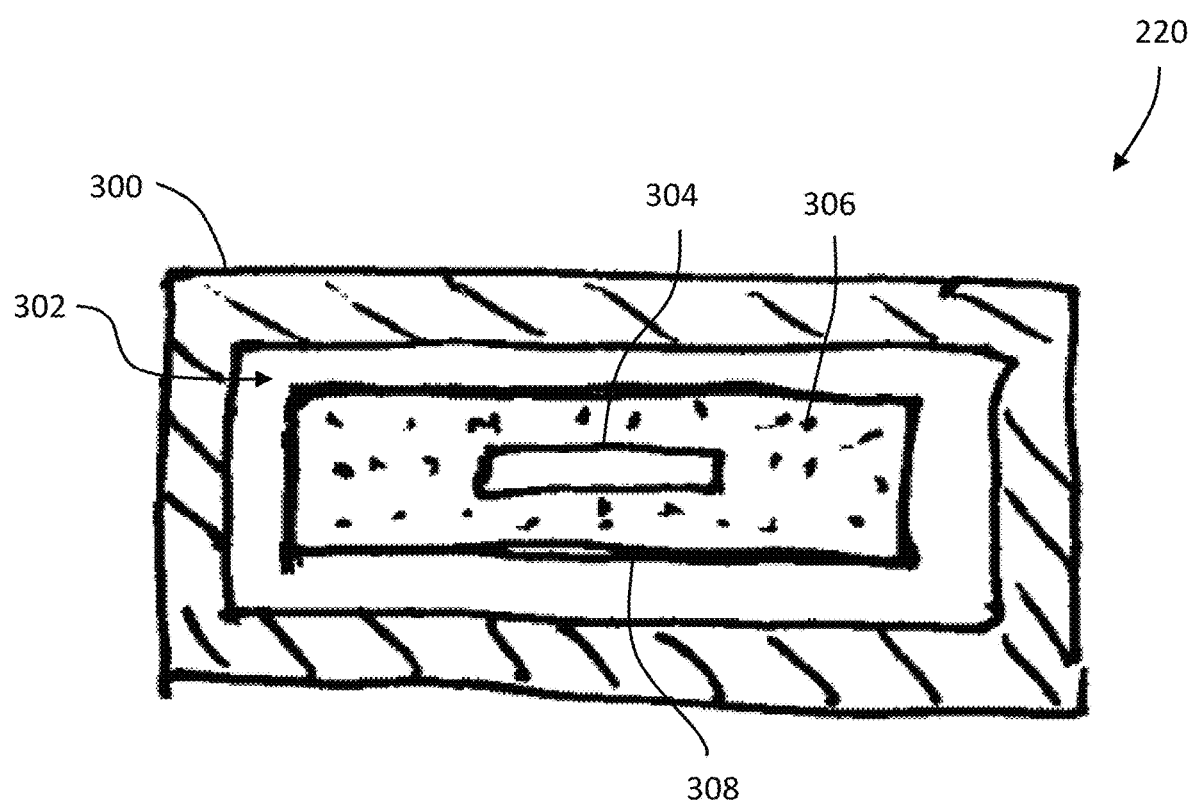
FIG. 3A is a sectional view of a portion of the sensor of FIG. 2A in accordance with an embodiment.

The upper ring portion 220 is comprising of a semi-circular housing 300 (FIG. 3A) made from an insulative material, such as high density polyethylene for example. In an embodiment, the housing 300 is made of a sufficient thickness to maintain electrical isolation of the components within the housing 300 in the event the sensor fell on the ac electrical power line. The housing 300 includes a hollow interior 302 that includes a sensor circuit board 304. As discussed herein, the sensor circuit board 304 includes a plurality of magnetic field point sensors. The magnetic field point sensors may be model A1308 manufactured by Allegro Microsystems for example. In the illustrated embodiment, the sensor circuit board 304 has a semi-circular shape that corresponds with the housing 300. In an embodiment, the magnetic field point sensors are mounted on an FR-4 printed circuit board material which is coupled to an aluminum support member. It has been found that this provides advantages in reducing the thermal expansion of the sensing circle resulting in a temperature error of about +/−0.1% per 100 C. In an embodiment, the sensor circuit board 304 is disposed within insulating potting material 306, such as platinum-cure silicone rubber for example. Surrounding the potting material is an electrostatic shield 308, such as a faraday cage for example.

Figure 3B:
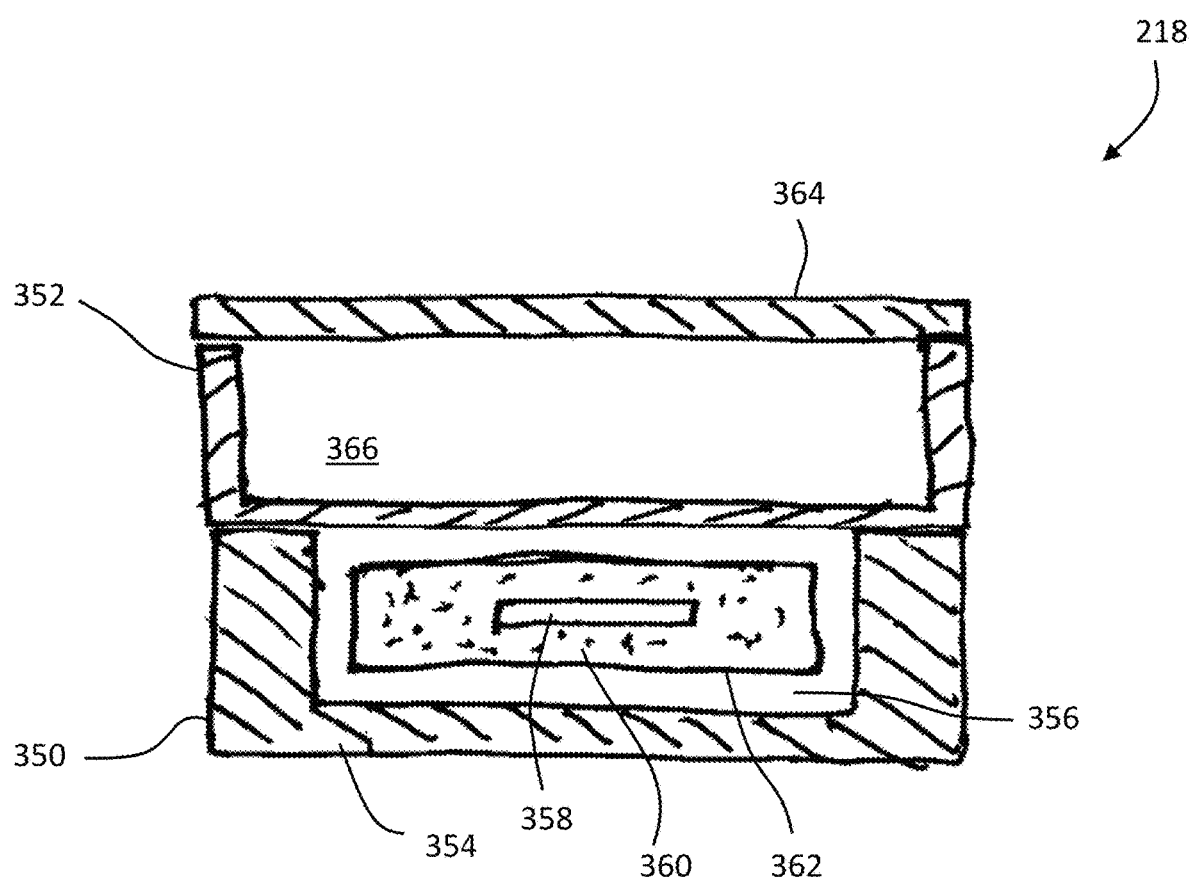
FIG. 3B is another sectional view of a portion of the sensor of FIG. 2A in accordance with an embodiment.

In an embodiment, the lower ring portion 218 is divided into two halve 350, 352 (FIG. 3B). The first half 350 is constructed in a similar manner to the upper ring portion 220. The first half 350 includes a semicircular first housing 354 having a hollow interior 356. Disposed within the hollow interior 356 is a sensor circuit board 358 having a semi-circular shape that corresponds to the shape of the first housing 354. In an embodiment, the sensor circuit board 358 is disposed in an insulative potting material 360 that is surrounded by an electrostatic shield 362, such as a faraday cage for example. In an embodiment, the magnetic field point sensors of sensor circuit board 358 may be mounted on an FR-4 printed circuit board material which is coupled to an optional aluminum support member (not shown) in the same manner as sensor circuit board 304. As will be discussed in more detail herein, the sensor circuit board 358 is electrically coupled to the sensor circuit board 304. The first housing 354 is made from an electrically insulative material, such as high density polyethylene for example. In an embodiment, the first housing is u-shaped with the open side enclosed by the second half 352. In other embodiments, the first housing 354 includes walls that extend about/enclose the sensor circuit board 358.

In an embodiment, the second half 352 comprises a second housing 364. The second housing 364 has a semi-circular shape that corresponds with the first half 350. In an embodiment, the second housing 364 is made from an insulative material, such as high density polyethylene. The walls of the second housing 364 define an interior portion 366 that is sized and shaped to receive the upper ring portion 220 when the upper ring portion is slid from the first position to the second position.

Figure 4A:
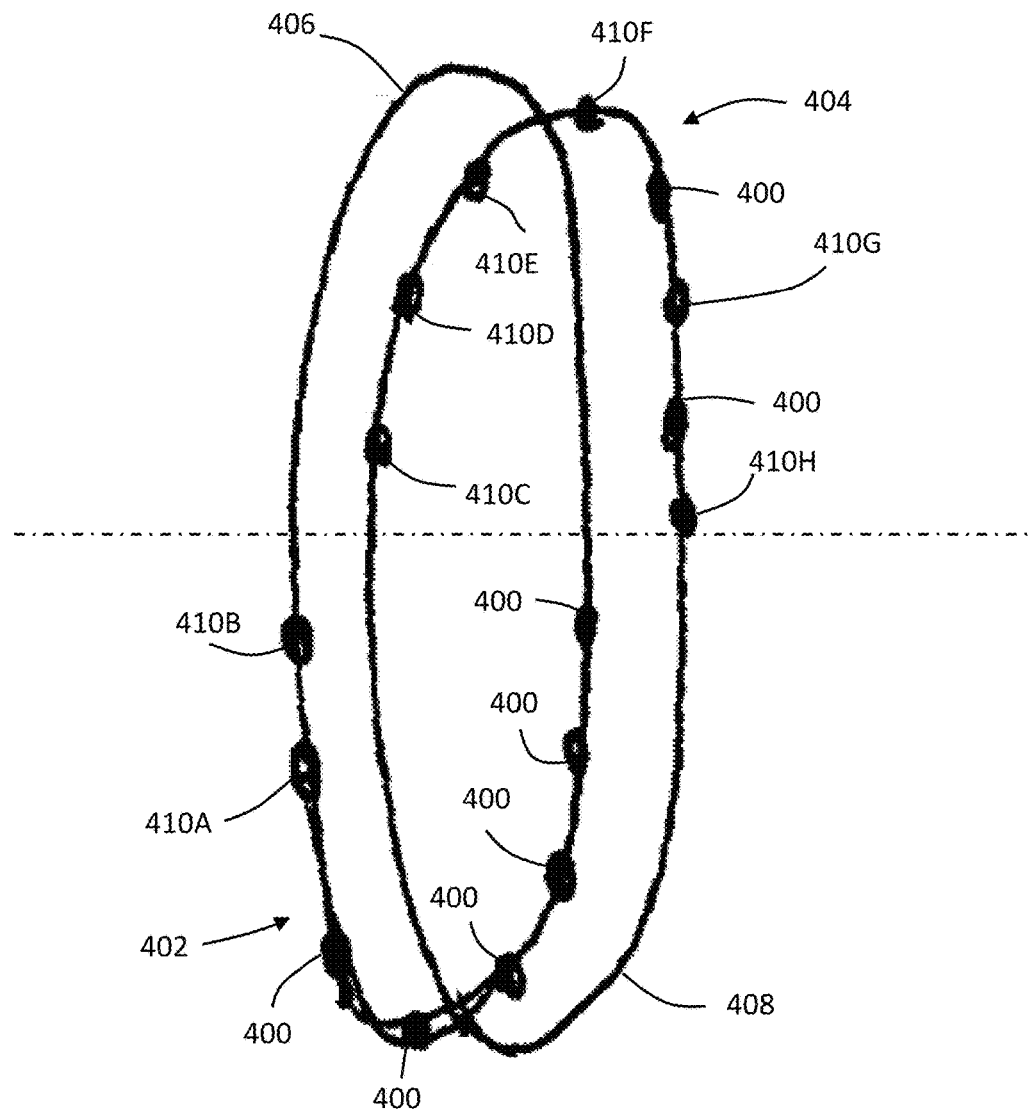
FIG. 4A is a schematic perspective view illustration of the arrangement of magnetic field sensors for the sensor of FIG. 2A in accordance with an embodiment.
Figure 4B:
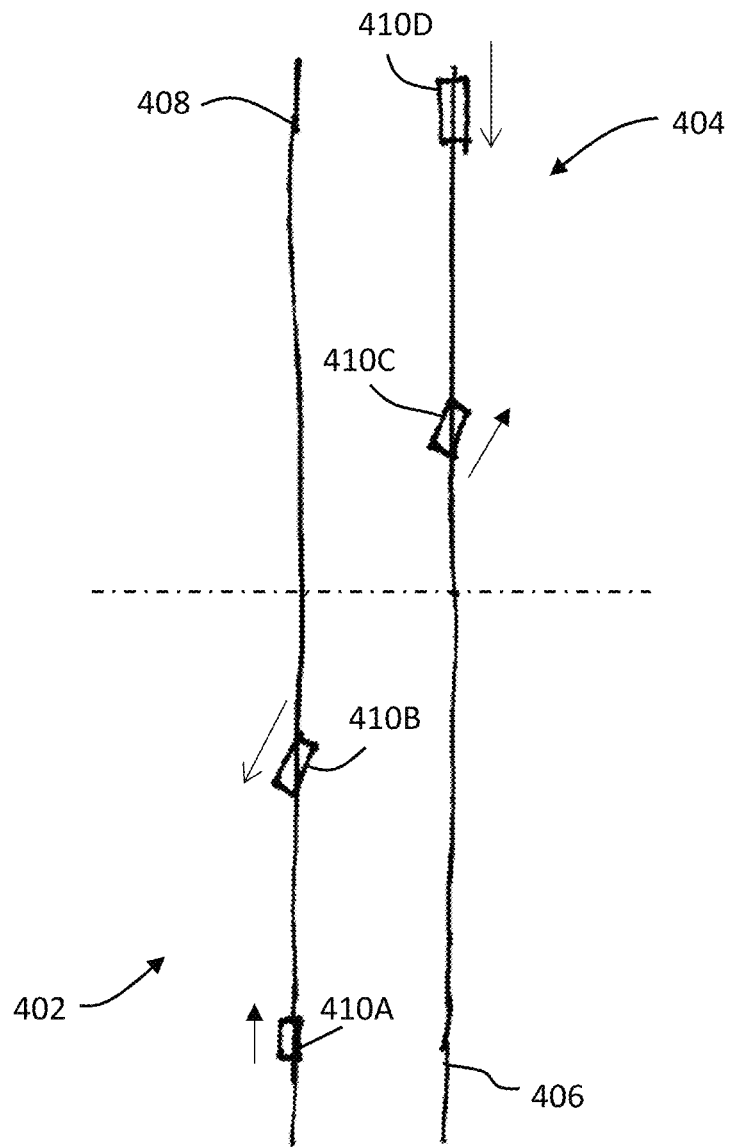
FIG. 4B is a schematic side view illustration of the arrangement of magnetic field sensors with sensing axis directions indicated for the sensor of FIG. 2A in accordance with an embodiment.
Figure 4C:
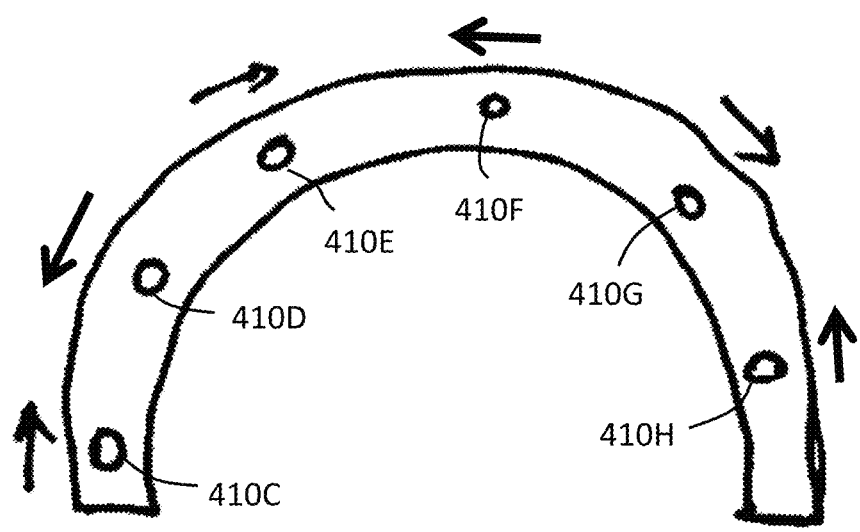
FIG. 4C is a schematic end view illustration of an arrangement of a portion of the magnetic field sensors with sensing axis directions indicated for the second of FIG. 2A in accordance with an embodiment.

Referring now to FIG. 4A-4C, an embodiment is shown of the arrangement of the magnetic field point sensors 400. In an embodiment, the magnetic field point sensors 400 are arranged into a first set of sensors 402 and a second set of sensors 404. The first set of sensors being associated with the lower ring portion 218 and the second set of sensors being associated with the upper ring portion 220. The first set of sensors are arranged in a first plane 406 and the second set of sensors are arranged in a second plane 408. As shown in FIG. 4B and FIG. 4C, the individual magnetic field point sensors, such as sensors 410A-410H for example, each have a different orientation of the sensing axis. In an embodiment, the sensors 410C, 410E, 410G (e.g. alternating sensors) have a sensing axis that is tangent to an arc on the planes 406, 408. The alternate sensors, such as sensors 410D, 410F, 410H the sensing axis is both tangent to the arc (FIG. 4C) and oppositely oriented relative to the sensors 410C, 410E, 401G. In some embodiments, sensors near the ends of the upper and lower rings (e.g. sensors 410B, 410C) may also be oriented on an angle to the planes 406, 408 (FIG. 4B). This angled orientation compensates for the small gap that exists between the two planes 406, 408. It should be appreciated that while FIG. 4C only shows the second set of sensors 404, the first set of sensors 402 are arranged in a similar manner. Further, it should be appreciated that while the illustrated embodiments show a particular number of magnetic field point sensors 400, the number and spacing of the sensors may be varied depending on the application.

Providing sensors 402, 404 provides advantages in reducing noise. The alternating of sensor orientations provides two electrical signals that are differential with respect to the detected magnetic field. In addition, the two electrical signals have common mode signals due to electrical noise present in the electronic circuit and power supply. By calculating the difference between the two signals, the result is sensitive to the magnetic field being sensed, but the common mode signals cancel, resulting in a lower noise floor on the output signal.

Figure 5:
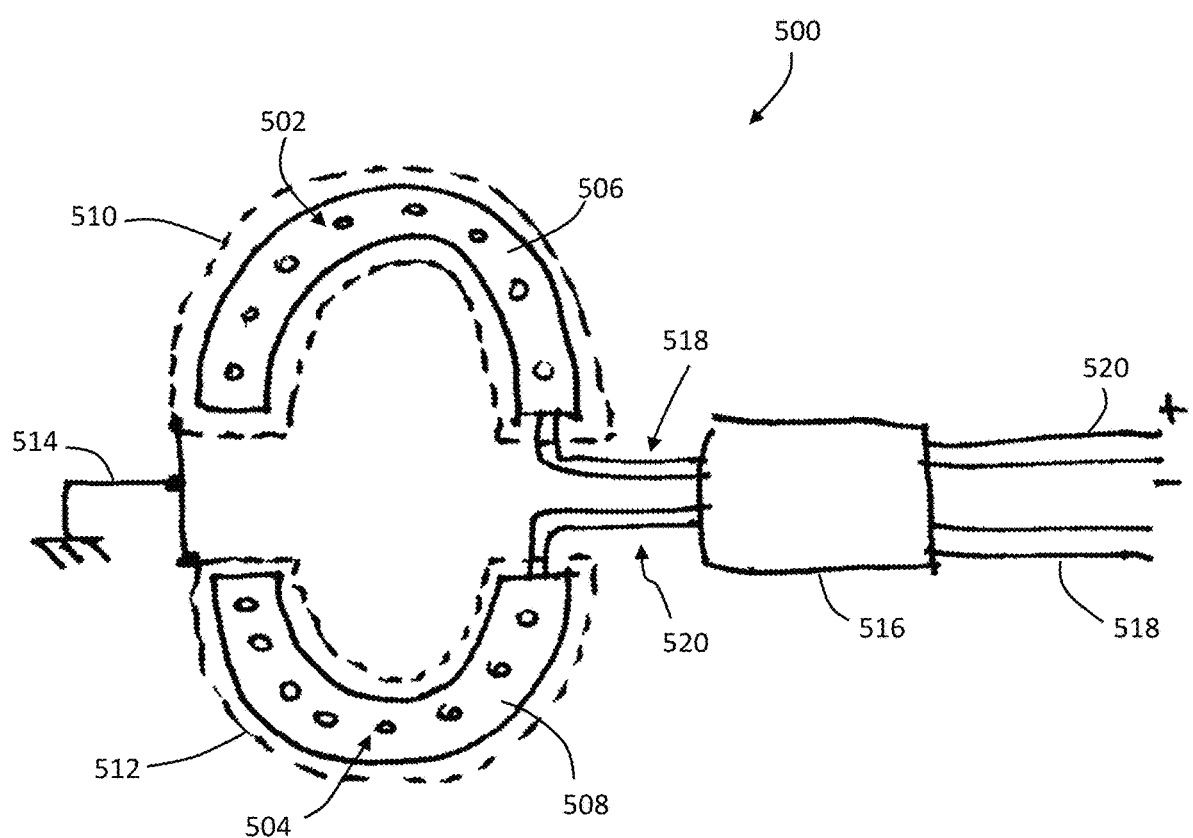
FIG. 5 is a schematic illustration of the electrical connections for the sensor of FIG. 2A in accordance with an embodiment.

Referring now to FIG. 5 a schematic illustration is shown of the electrical connections of the sensor system 500. It should be appreciated that the sensor system 500 may be physically constructed in a similar manner to sensor system 200. In this embodiment, the sensor system 500 includes a first set of magnetic field point sensors 502 and a second set of magnetic field point sensors 504. Each of the sets of magnetic field point sensors 502, 504 being arranged on a circuit board 506, 508 in a semi-circular shape. The circuit boards 506, 508 are each surrounded by an faraday cage or electrostatic shield 510, 512. The electrostatic shields 510, 512 are coupled to a ground 514.

The circuit boards 506, 508 are configured to route signals from the magnetic field point sensors 502, 504 to an interface member 516 via conductors 518, 520. In an embodiment, the interface member 516 is configured to receive and average the signals from the magnetic field point sensors 502, 504 and output a low energy (0-10 VAC) signal indicating the level of current passing through the conductor being monitored. The signals are transmitted via conductors 518 to a data acquisition system that digitizes the signal, stores values and communicates the data to local or remote users. The interface member 516 is further configured to receive an input electrical power (12 VDC) via conductor 520.

Figure 6:
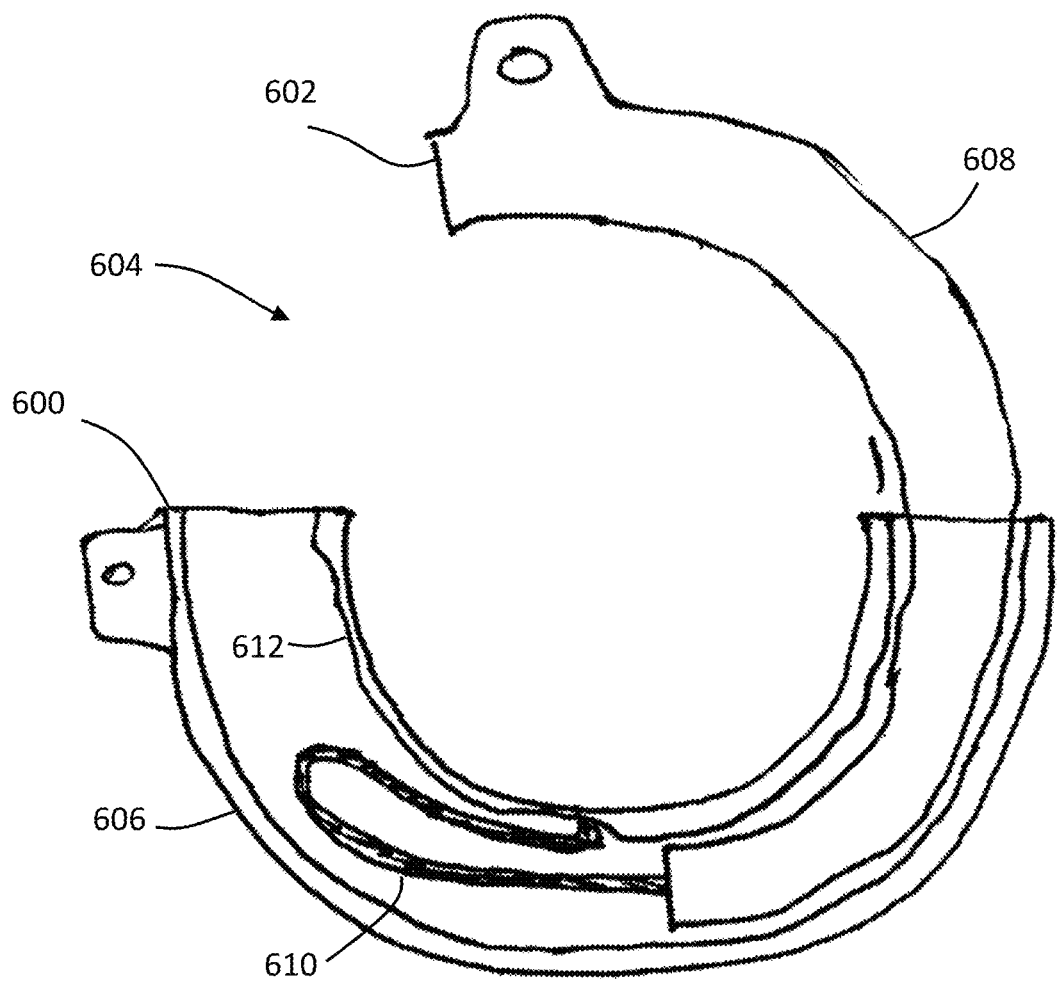
FIG. 6 is a schematic section view of the housings of the sensor of FIG. 2A moved to a second position in accordance with an embodiment.

Referring now to FIG. 6, an embodiment of the lower ring portion 606 and the upper ring portion 608 is shown in the open or second position. In this position a gap 604 is defined between an end 600 of the lower ring portion 606 and an end 602 of the upper ring portion 608. It should be appreciated that the gap allows the sensor system to be installed over an active or "hot" power line. When the upper ring portion 608 is moved to the second position from the first position, the upper ring portion 608 slides within a channel (e.g. interior portion 366). In an embodiment, the circuit board within the upper ring portion 608 includes a conductor 610 that extends into the channel (e.g. interior portion 366) and exits via a centrally located opening on an inner diameter of the lower ring portion 606. In an embodiment that lower ring portion 606 includes a slot 612 that is sized to receive the conductor 610 when the upper ring portion 608 is slid into the lower ring portion 606. In other words, the slot 612 provides a relief area where the conductor 610 can be positioned when the upper ring portion 608 is fully inserted into the lower ring portion 606.

Figure 7A:
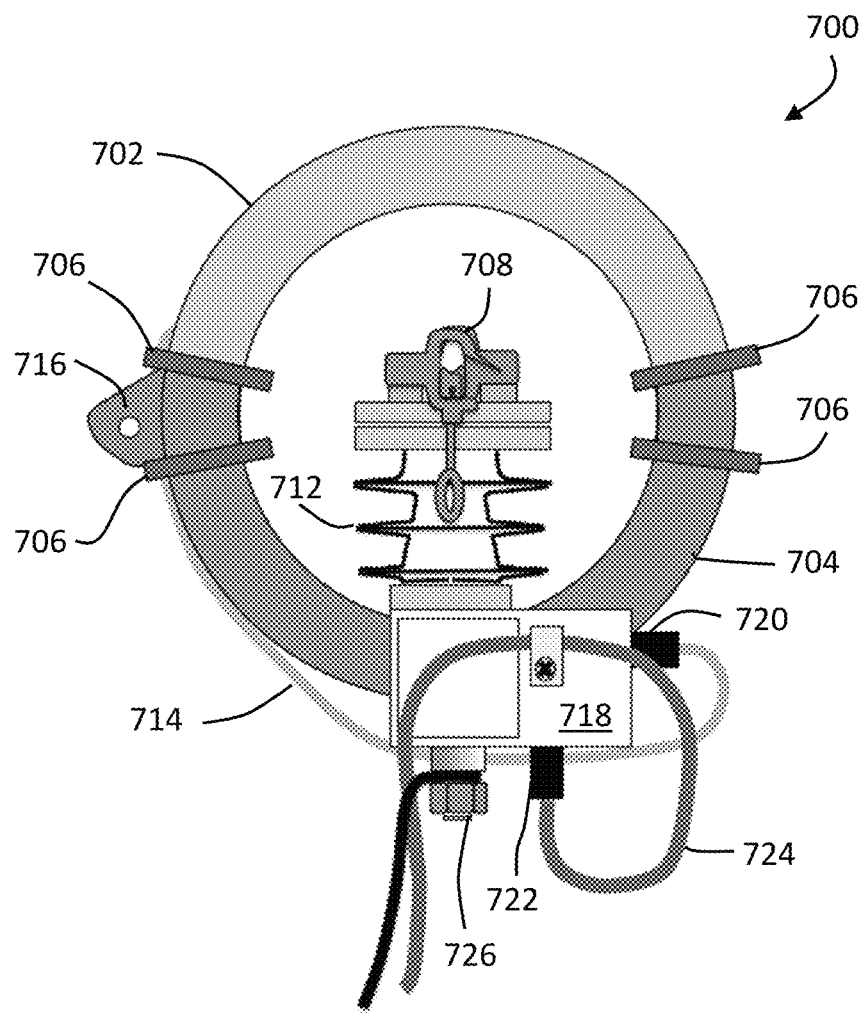
FIG. 7A is an end view illustration of a sensor that measures current and/or voltage in a pole mounted power line of the utility electrical distribution system of FIG. 1 in accordance with another embodiment.
Figure 7B:
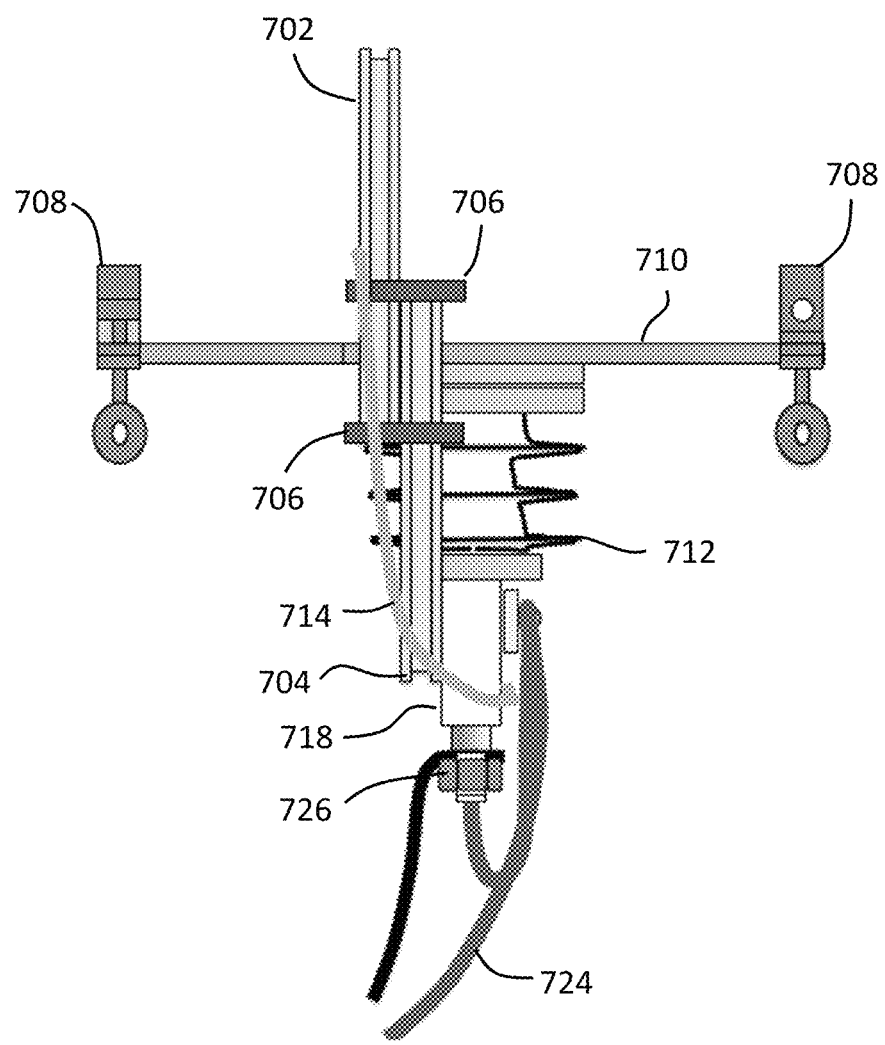
FIG. 7B is a side view illustration of the sensor of FIG. 7A in accordance with an embodiment.

Referring now to FIG. 7A and FIG. 7B, another embodiment of a sensor system 700 for measuring electrical characteristics on a pole mounted electrical power line is shown. In this embodiment, the upper ring portion 702 and lower ring portion 704 are coupled by guides 706. The clamps 708, bar 710 and insulator 712 are arranged the same as sensor system 200. Within the upper ring portion 702 and lower ring portion 704, the sensor system 700 includes a circuit board with a plurality of magnetic field point sensors in the same manner as sensor system 200.

In this embodiment, the upper ring portion 702 slides next to the lower ring portions 704 along a path defined by guides 706. The conductor 714 from the circuit board in the upper ring portion 702 exits the upper ring portion 702 adjacent the tab 716 and enters the electronics housing 718 at a port 720. The electronics housing 718 further includes a second port 722 that connects to a cable 724 that provides both input electrical power (12 VDC) and output the low energy signal indicating the value of the electrical characteristic (e.g. current or voltage) that is present in the electrical power line being monitored. The electronics housing 718 further includes a ground connection 726.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A sensor system for an electrical conductor, the sensor system comprising:
    a first housing;
    a second housing slidably coupled to the first housing from a first position to a second position, the first housing and the second housing cooperating to form a ring around the electrical conductor when the second housing is in the first position;
    a first plurality of magnetic field sensors operably coupled to the first housing, each of the first plurality of magnetic field sensors having a different sensing axis, each of the first plurality of magnetic field sensors being configured to output a first signal in response to electrical power flowing through the electrical conductor;
    a second plurality of magnetic field sensors operably coupled to the second housing, each of the second plurality of magnetic field sensors having a different sensing axis, each of the second plurality of magnetic field sensors being configured to output a second signal in response to the electrical power flowing through the electrical conductor; and
    a circuit is electrically coupled to receive a plurality of first signals from the first plurality of magnetic field sensors and the second plurality of magnetic field sensors.

2. The sensor system of claim 1, wherein:
    the first housing has a first end;
    the second housing has a second end, the first end and the second end defining a gap when the second housing is in the first position; and
    wherein the gap is sized to allow the electrical conductor to pass therethrough when the sensor system is being installed on the electrical conductor.

3. The sensor system of claim 1, further comprising a first electrostatic board operably coupled to the first plurality of magnetic field sensors and a second electrostatic board operably coupled to the second plurality of magnetic field sensors.

4. The sensor system of claim 1, wherein the first housing and the second housing are made from an electrically insulative material.

5. The sensor system of claim 4, wherein the insulative material is high density polyethylene.

6. The sensor system of claim 1, wherein the first housing includes a first tab and the second housing includes a second tab.

7. The sensor system of claim 6, wherein the first tab and the second tab each include a hole sized to receive a hot stick.

8. The sensor system of claim 1, wherein the first housing and the second housing are offset from each other.

9. The sensor system of claim 1, wherein the second housing includes an internal channel sized to receive the second plurality of magnetic field sensors.

10. The sensor system of claim 9, further comprising a sensor conductor electrically coupling the first plurality of magnetic field sensors and the second plurality of magnetic field sensors.

11. The sensor system of claim 10, wherein the internal channel includes a slot sized to receive the sensor conductor when the second housing is in the first position.

12. The sensor system of claim 1, wherein the first signal and second signal correspond to a level of current flowing through the electrical conductor.

13. The sensor system of claim 1, wherein the first signal and second signal correspond to a voltage level of the electrical power flowing through the electrical conductor.

14. The sensor system of claim 1, further comprising at least one electrical insulator operably coupled to a first clamp and a second clamp, the first clamp and the second clamp being configured to secure the electrical conductor to the sensor system.

15. The sensor system of claim 14, wherein the at least one electrical insulator is operably coupled to the first housing and the second housing to position the electrical conductor in a fixed position that is centrally located between the first housing and the second housing.

16. The sensor system of claim 14, further comprising a support bar coupled between the at least one electrical insulator, the first clamp and the second clamp.

17. The sensor system of claim 16, wherein the support bar is made from a conductive material.

18. The sensor system of claim 17, wherein the conductive material is aluminum.

19. The sensor system of claim 16, wherein the first clamp or second claim are electrically isolated from the support bar.

20. The sensor system of claim 14, wherein a conductor axis of the electrical conductor is perpendicular to a plane defined by the first housing and the second housing.

21. A method of measuring an electrical characteristic of an electrical conductor, the method comprising:
providing a sensor system comprising:
a ring assembly having a first housing and, a second housing, the second housing movable from a first position to a second position; and
an electronics assembly coupled to the ring assembly and to an insulator body, the insulator body operably coupled to a pair of clamps;
sliding the second housing to the second position to define a gap between a first end of the first housing and a second end of the second housing;
coupling the pair of clamps to the electrical conductor;
sliding the second housing to the first position;
receiving a magnetic field generated by the electrical conductor by a first plurality of magnetic sensors arranged within the first housing and generating a first plurality of signals by the first plurality of magnetic sensors; and
receiving the magnetic field by a second plurality of magnetic sensors arranged within the second housing and generating a second plurality of signals by the second plurality of magnetic sensors.

22. The method of claim 21, further comprising:
arranging each of the first plurality of magnetic sensors to have a different sensing axis; and
arranging each of the second plurality of magnetic sensors to have a different sensing axis.

23. The method of claim 21, wherein the electrical characteristic is a current level of electrical power flowing through the electrical conductor.

* * * * *